United States Patent
Arvin et al.

(10) Patent No.: US 9,601,423 B1
(45) Date of Patent: Mar. 21, 2017

(54) UNDER DIE SURFACE MOUNTED ELECTRICAL ELEMENTS

(71) Applicant: International Business Machines Corporation, Armonk, NY (US)

(72) Inventors: Charles L. Arvin, Savannah, GA (US); Jon A. Casey, Poughkeepsie, NY (US); Brian M. Erwin, Lagrangeville, NY (US); Steven P. Ostrander, Poughkeepsie, NY (US); Brian W. Quinlan, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/974,484

(22) Filed: Dec. 18, 2015

(51) Int. Cl.
*H01L 21/02* (2006.01)
*H01L 23/498* (2006.01)
*H01L 25/16* (2006.01)
*H01L 23/00* (2006.01)
*H01L 21/48* (2006.01)

(52) U.S. Cl.
CPC .... *H01L 23/49822* (2013.01); *H01L 21/4853* (2013.01); *H01L 21/4857* (2013.01); *H01L 23/49827* (2013.01); *H01L 23/49838* (2013.01); *H01L 24/17* (2013.01); *H01L 25/16* (2013.01); *H01L 2224/16055* (2013.01); *H01L 2224/16057* (2013.01); *H01L 2224/16235* (2013.01); *H01L 2224/16265* (2013.01); *H01L 2924/14* (2013.01); *H01L 2924/1427* (2013.01); *H01L 2924/19041* (2013.01); *H01L 2924/19042* (2013.01)

(58) Field of Classification Search
CPC ... H01L 2924/1517; H01L 2924/15311; H01L 21/486; H01L 2924/14; H01L 2224/24195; H01L 2924/19041; H01L 23/50
USPC ............... 257/528, 532, 691, 758, 686, 777
See application file for complete search history.

(56) References Cited

U.S. PATENT DOCUMENTS

| | | | |
|---|---|---|---|
| 5,475,568 A | 12/1995 | Umesato | |
| 6,407,929 B1 * | 6/2002 | Hale | H01L 23/49822 257/724 |
| 6,818,469 B2 * | 11/2004 | Mori | H05K 1/162 257/250 |
| 7,198,996 B2 | 4/2007 | Nakatani et al. | |
| 8,110,896 B2 * | 2/2012 | Hsu | H05K 1/0231 257/532 |
| 8,264,846 B2 | 9/2012 | Jones et al. | |

(Continued)

FOREIGN PATENT DOCUMENTS

| | | |
|---|---|---|
| CN | 103943614 A | 7/2014 |
| JP | 06045476 A | 2/1994 |

(Continued)

*Primary Examiner* — S. V. Clark
(74) *Attorney, Agent, or Firm* — Cantor Colburn LLP; Steven Meyers

(57) ABSTRACT

A laminate includes a buildup layer having a top and a bottom and a solder mask contacting the top. The laminate also includes a circuit element disposed on the top of the buildup layer and at least partially covered by the solder mask, the circuit element including a first via formed therein that allows for a power signal provided to an underside of the circuit element to be provided to a first connection on a top of the circuit element.

15 Claims, 7 Drawing Sheets

(56) References Cited

U.S. PATENT DOCUMENTS

| | | | |
|---|---|---|---|
| 8,564,121 B2 | 10/2013 | Ihara et al. | |
| 8,921,159 B2 | 12/2014 | Pruitt | |
| 8,933,473 B1 | 1/2015 | Dubin | |
| 8,937,381 B1* | 1/2015 | Dunlap | H01L 23/3128 |
| | | | 257/686 |
| 9,128,121 B2 | 9/2015 | Fledell et al. | |
| 2004/0121266 A1* | 6/2004 | Lee | H05K 1/162 |
| | | | 430/313 |
| 2004/0256731 A1* | 12/2004 | Mao | C08L 65/00 |
| | | | 257/773 |
| 2006/0118931 A1* | 6/2006 | Ho | H01L 23/49822 |
| | | | 257/678 |
| 2008/0217739 A1* | 9/2008 | Lien | H01L 23/49822 |
| | | | 257/535 |
| 2009/0102045 A1* | 4/2009 | Hsu | H01L 23/49827 |
| | | | 257/701 |
| 2010/0013068 A1* | 1/2010 | Huang | H01L 21/4857 |
| | | | 257/676 |
| 2014/0070380 A1 | 3/2014 | Chiu et al. | |
| 2014/0117552 A1 | 5/2014 | Qian et al. | |
| 2015/0221659 A1 | 8/2015 | Wang | |
| 2015/0245491 A1 | 8/2015 | Lamorey et al. | |
| 2016/0064329 A1* | 3/2016 | Lee | H01L 23/5389 |
| | | | 257/659 |

FOREIGN PATENT DOCUMENTS

| | | |
|---|---|---|
| JP | 4296687 B2 | 7/2009 |
| JP | 2015141999 A | 8/2015 |
| KR | 970007843 B1 | 5/1997 |
| KR | 1020000024837 A | 5/2000 |
| WO | 2015130264 A1 | 9/2015 |

* cited by examiner

UNDER DIE SURFACE MOUNTED ELECTRICAL ELEMENTS

BACKGROUND

The present invention relates to microelectronic devices and, and more specifically, to forming and utilizing under die surface mounted devices.

Once formation of semiconductor devices and interconnects on a semiconductor wafer is completed, the semiconductor wafer is diced into semiconductor chips, or "dies." Functional semiconductor chips are then packaged to facilitate mounting to a larger device.

The packaging generally provides mechanical protection and electrical connections to an external element. One typical packaging technology is Controlled Collapse Chip Connection (C4) packaging, which employs C4 balls each of which contacts a C4 pad on the semiconductor chip and another C4 pad on a packaging substrate. The packaging substrate may then be assembled on a larger circuit board. The combined chip and laminate may be referred to as a module in some cases. Of course, a module may include other elements such as a lid.

Mounting electrical components such as discrete resistors, discrete capacitors, transistors, digital circuits, etc. on laminate is well known. It is common for such laminate to contain many layers. Typically, most of the components are mounted on the surface. Some of the conductors used to interconnect the components may also be printed on the surface. The inner layers are primarily used to interconnect the components through other conductors printed on these inner layers and conductive vias passing through the outer and inner layers. For complex circuits, the surface area must be carefully allocated to fit the many requisite components. Also, in the case of capacitor components, it is desirable to position some of the capacitors near other, associated components to minimize path length and thereby minimize parasitic inductance.

SUMMARY

According to an embodiment of the present invention, a laminate is disclosed. The laminate includes a buildup layer having a top and a bottom and a solder mask contacting the top. The laminate also includes a circuit element disposed on the top of the buildup layer and at least partially covered by the solder mask, the circuit element including a first via formed therein that allows for a power signal provided to an underside of the circuit element to be provided to a first connection on a top of the circuit element.

According to another embodiment of the present invention, a module that includes a laminate is disclosed. The laminate includes a buildup layer having a top and a bottom and a solder mask contacting the top. The laminate also includes a circuit element disposed on the top of the buildup layer and at least partially covered by the solder mask, the circuit element including a first via formed therein that allows for a power signal provided to an underside of the circuit element to be provided to a first connection on a top of the circuit element. The module includes a die disposed over the laminate and in electrical communication with the circuit element.

According to another embodiment of the present invention, a method of forming a laminate is disclosed. The method includes: forming a buildup layer having a top and a bottom; disposing a circuit element on the top of the buildup layer, the circuit element including a first via formed therein that allows for a power signal provided to an underside of the circuit element to be provided to a first connection on a top of the circuit element; and forming a solder mask over at least a portion of the circuit element and the top.

DETAILED DESCRIPTION

Provided herein is a module (e.g., combination of a die and a laminate) that includes one or more devices located totally or partially between the die and the laminate. The devices may include, for examples, capacitors, resistors, voltage regulators and inductors. In one embodiment, the devices are locate in covered by a solder mask layer and sit on an upper buildup layer of the laminate.

Figure 1:
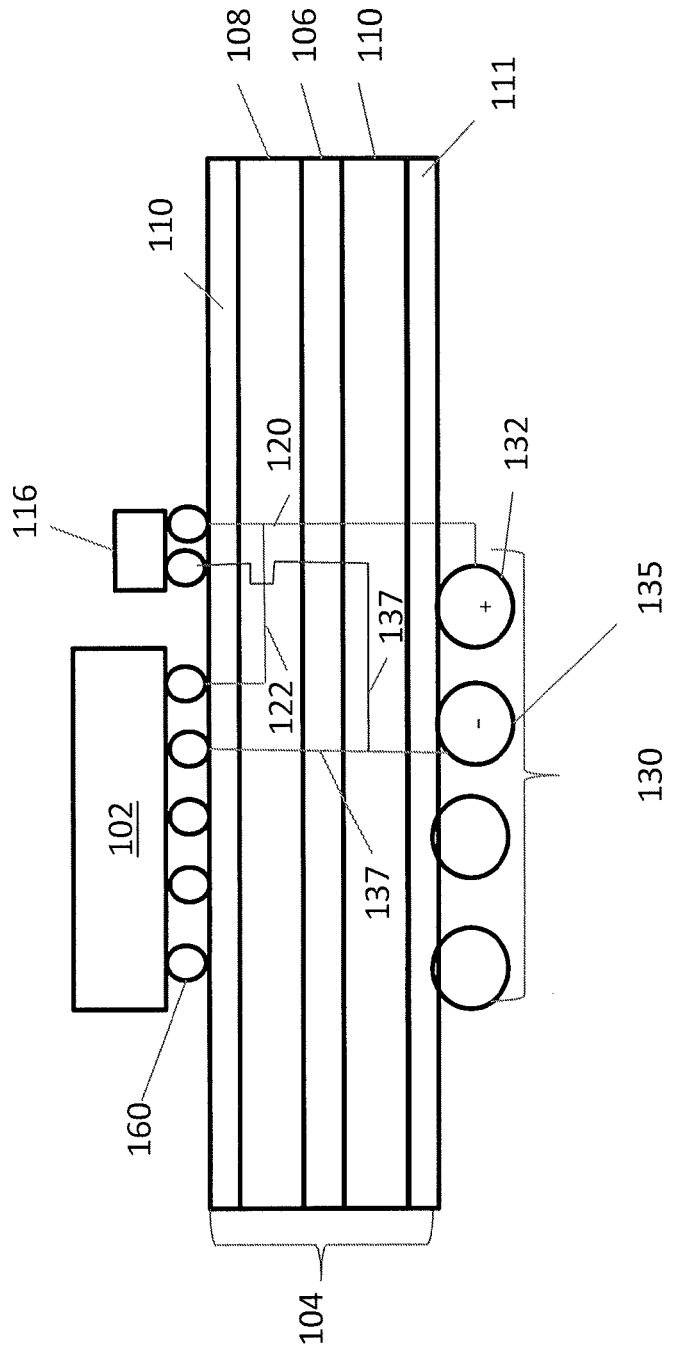
FIG. 1 shows a side view of an example of laminate having a die and an electrical element connected thereto.

With reference now to FIG. 1 a simple block diagram of a portion of a microelectronic device 100 is shown. The device 100 includes a chip 102. The chip can be an integrated circuit or other type of device and is sometimes referred to as die. A decoupling capacitor or other circuit element 116 (e.g., a resistor, inductor, voltage regulator) may also be supported. The purpose of such elements is known and further, as disclosed herein, it may be beneficial that such elements be as close to the chip 102 as possible. While the following discussion may refer to a capacitor, it shall be understood that element 116 may be any of the elements discussed above or any other element.

The chip 102 and element 116 are supported by and carried on a laminate 104. The laminate 104 may be formed (but need not be) such that it includes a core 106. The core 106 may be formed of a glass-cloth polymer in one embodiment.

The laminate 104 also includes a top buildup layer 108 and a bottom buildup layer 110. The top and bottom buildup layers are typically formed of an organic polymer. The bottom buildup layer 110 may include means for connecting a ball grid array 130 so that power, ground and data can be delivered from an external to the chip 102 or vice versa. Of course, the ball grid array 130 may be replaced with a so-called land grid array in certain instances. Either allows the module (combination of chip 102 and laminate 104) to be connected, for example, to a printed circuit board. Connection elements (e.g., vias) pass through the buildup layers 108, 110. For simplicity sake, only three connection elements (connections 120, 122 and 137) are shown and are discussed further below.

A solder mask 110 may be formed on top of the top buildup layer 108. The solder mask 110 includes access locations for connections from the chip 102 and element 116 to the laminate 104. As shown, solder balls 160 are used to form such connections. Of course, other connection mechanisms may be utilized. To make the connections, a reflow process is performed that may give rise to the stresses on the laminate described above. In some cases, a solder mask 111 is also formed on the bottom of the laminate 104.

For example, as shown, a switching signal may be received from a power element 132 of the array 130. The signal traverses connections 120 to a capacitor 116. While shown as a direct line, the connection 120 may pass through multiple vias in buildup layers 108, 110 to traverse different levels therein. As such, connections 120 are illustrative only. The signal received by capacitor 116 through connection 120 is also provided to a power terminal of the die 102 through connection 122. Of course, the connection 122 may pass through multiple vias in buildup layers 108, 110 to traverse different levels therein. The capacitor 116 may be referred to as "decoupling capacitor" in some cases. The purpose of the capacitor 116, in such a case, is to provide a "near" power supply to thereby reduce inductive losses in the switching signal. Thus, the closer the capacitor 116 is to the die, the better. Both the capacitor 116 and the die 102 are connected to a common ground or negative terminal 135 in the illustrated embodiment along connection 137.

As will be understood, the longer the connection 122, the more inductance may be added to the system. Such inductance is undesirable.

Figure 2:
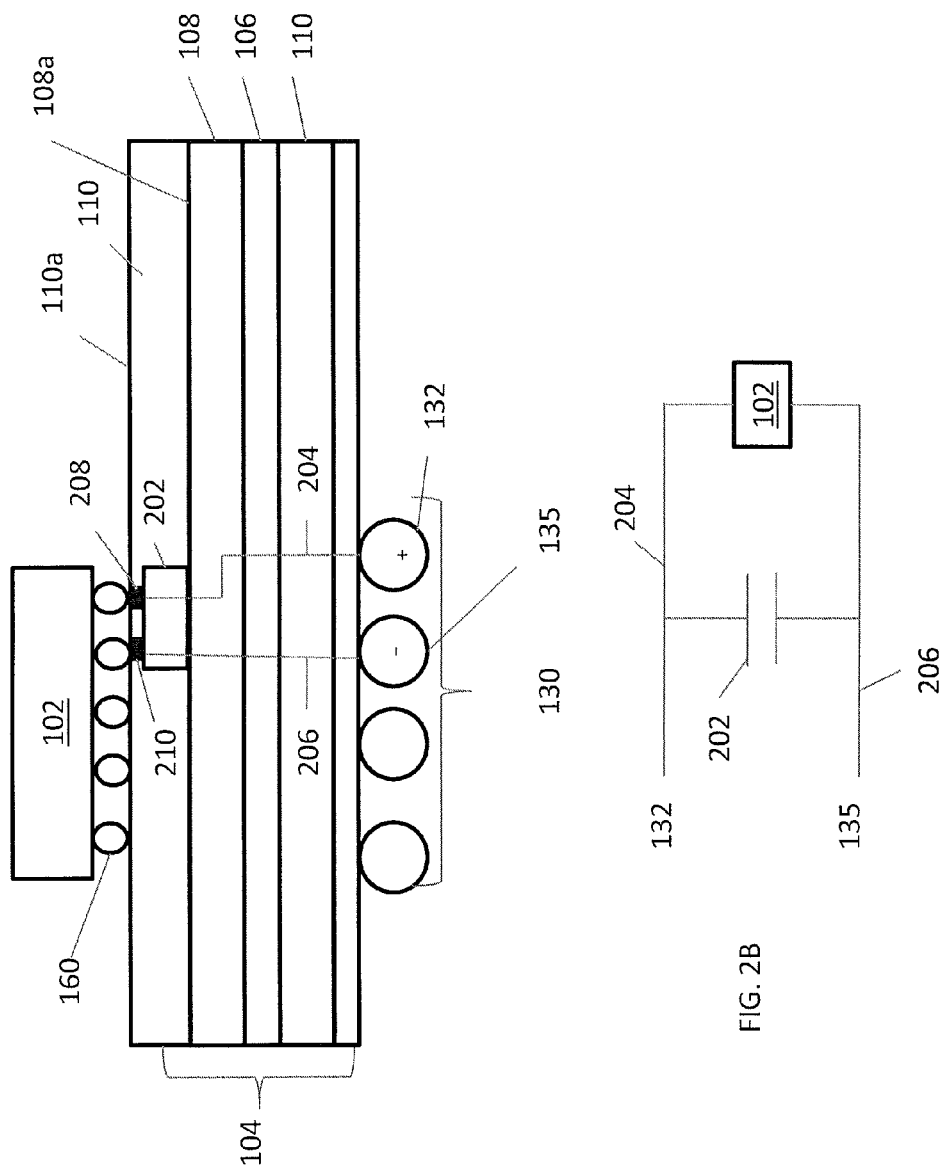
FIGS. 2A-2B show a side view of a laminate with a die and an electrical element connected below the die and an circuit diagram of the connections between the element and the die.

FIG. 2A shows an example of a die 102 disposed on a laminate 104. In this example, rather than being on top of the solder mask 110 as shown above, circuit element 220 is formed under a top surface 110a of the solder mask 110. Stated differently, the circuit element 202 may be disposed between the top surface 110a of the solder mask 110 and a top surface 108a of the buildup layer 108. The circuit element may be a decoupling capacitor or any other type of circuit element such as, for example, a resistor, inductor, or voltage regulator. The purpose of such elements is known and further, as disclosed herein, it may be beneficial that such elements be as close to the chip 102 as possible. While the following discussion may refer to a capacitor, it shall be understood that element 202 may be any of the elements discussed above or any other element.

The laminate includes a power connection 204 and a ground or negative connecting 206 connected, respectively, to positive 132 and negative 134 solder balls. The connections 204, 206 may be formed as vias in one embodiment. As illustrated, the connections 204, 206 pass completely through the element 202. It shall be understood that a portion of the connections 204, 206 may be formed inside the element and connected to vias in the laminate that connect to solder balls 132, 135. By allowing for such a direction connection, the element (e.g., capacitor 202) can be configured for parallel connection with the die 102 as shown in FIG. 2B. If shall be understood that die 102 is generally shown in FIG. 2B and that the parallel connection could be with a particular integrated circuit (IC) of the die (see, e.g., FIG. 5).

As will be apparent to the skilled artisan after viewing the above, such an in line parallel connection may reduce the distance of connection lines between the element 202 and the die 102 may be reduced. This can reduce line inductance and, thus, allow for faster operation in some instances. As shown, the element 202 is completely under the die 102. In other embodiments, the element 202 may only be partially under the die 102 (see, e.g., FIG. 5).

In one embodiment, the element 202 may include positive and negative connection points 208, 210 to allow for connection to the die 102. These connection points can be any type of conductor and could be integrally formed as part of the element 202 are added during fabrication. As illustrated, the element 202 is directly on the top 108a of the buildup layer 108. Of course, an insulator or any other element could be disposed between the element and the top 108a of the buildup layer 108.

In one embodiment, a fully formed element 202 including connection points 208, 210 is placed on top of the buildup layer 108 such that the connection points 204, 206 terminate at the connection points 208, 210 are in electrical contact with balls 135, 137 (e.g., aligned with vias in the buildup layer 108). Then, the solder mask 110 is formed over the buildup layer 108 and the element 202 and the connection points 208, 210 may then be exposed so the a connection between them and solder balls 160 can be made to allow for electrical communication between the die 102 and the element 202 (and, of course, solder balls 132, 137).

Figure 3:
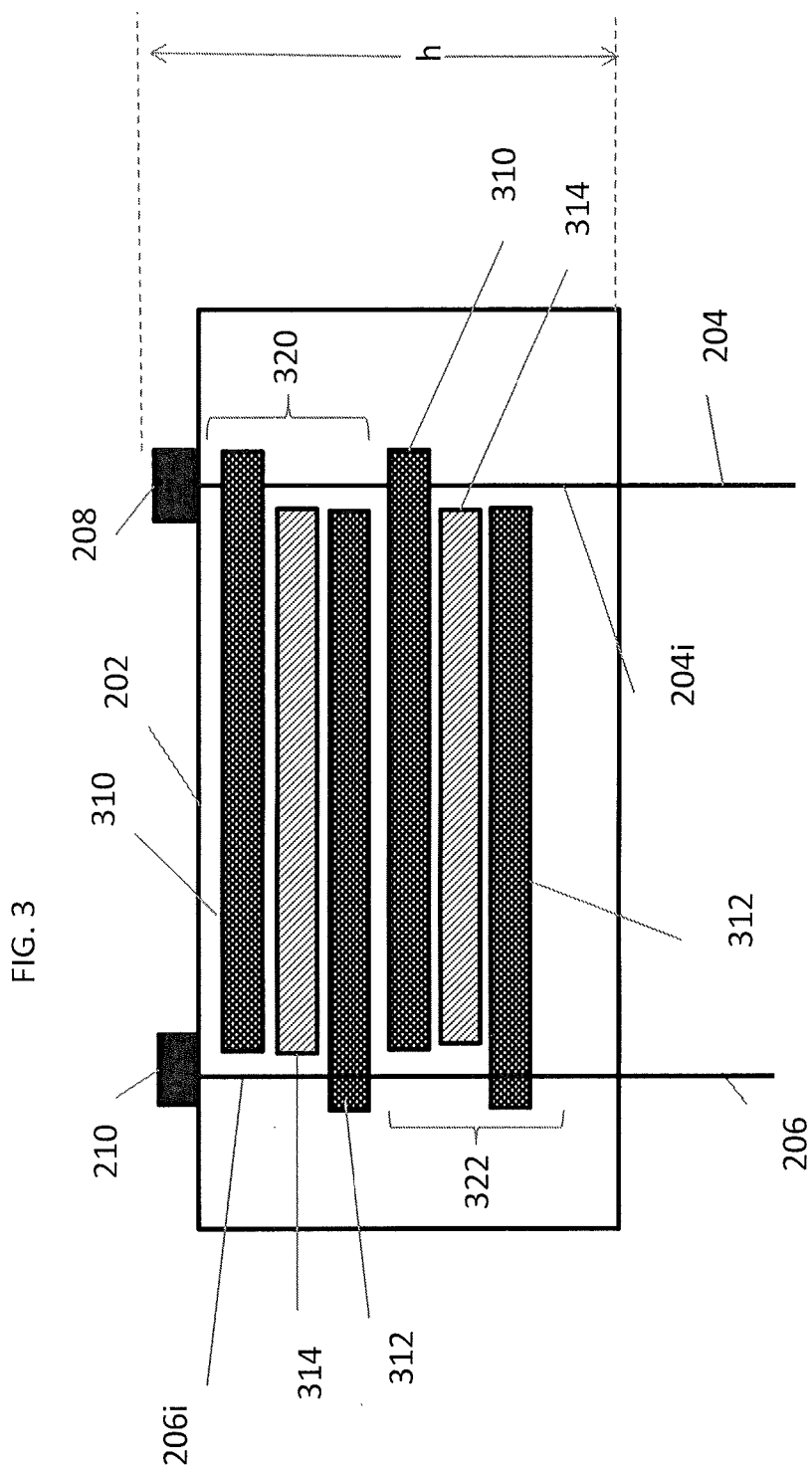
FIG. 3 shows an example electrical element implemented as a capacitor.

FIG. 3 shows an example of an element 202 implemented as a capacitor. In one embodiment, the capacitor is a so-called metal, insulator, metal (MIM) capacitor. Positive and negative connections 204, 206 are shown as including portions that are internal to the capacitor 202 and are denoted as 204i and 206i, respectively. These internal connections may be formed as through silicon vias (TSV's) in one embodiment.

The embodiment of the capacitor 202 shown in FIG. 3 actually includes two parallel capacitors 320, 322 with each being formed by a positive plate 310 connected to connection 204i and a negative plate 312 connection 206i. The plates of capacitors 320, 322 are separated, at least partially, by an insulating material 314 such as a dielectric.

In one embodiment, the component 202 has height (h) that is less than 50 µm. In another embodiment, the component 202 has height (h) that is less than 20 µm. It shall be understood that the connecting points 208, 210 may not actually extend upwardly from a top surface of the element 202 and such is shown only for clarity.

Figure 4:
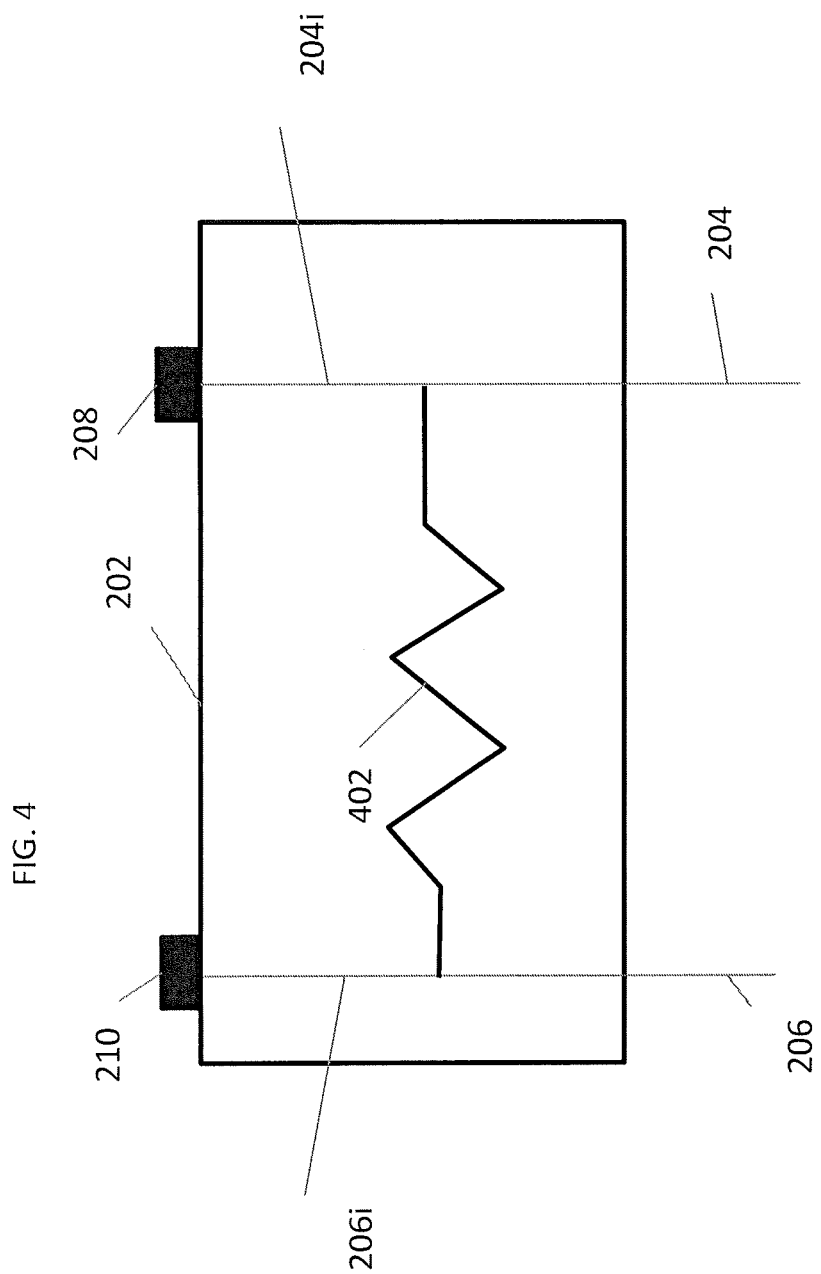
FIG. 4 shows an example electrical element implemented as a resistor.

The previous example focused on a capacitor. In another embodiment, the element 202 could be resistor as shown in FIG. 4. The resistor 202 of FIG. 4 includes positive and negative connections 204, 206 are shown as including portions that are internal to the capacitor 202 and are denoted as 204i and 206i, respectively. These internal connections may be formed as through silicon vias (TSV's) in one embodiment. A restive element 402 is shown connecting the internal connections 204i and 206i. As one of skill will realize, such a connection will allow the resistor to 202 to be coupled in parallel to any element connected between connecting points 208 and 210.

Figure 5:
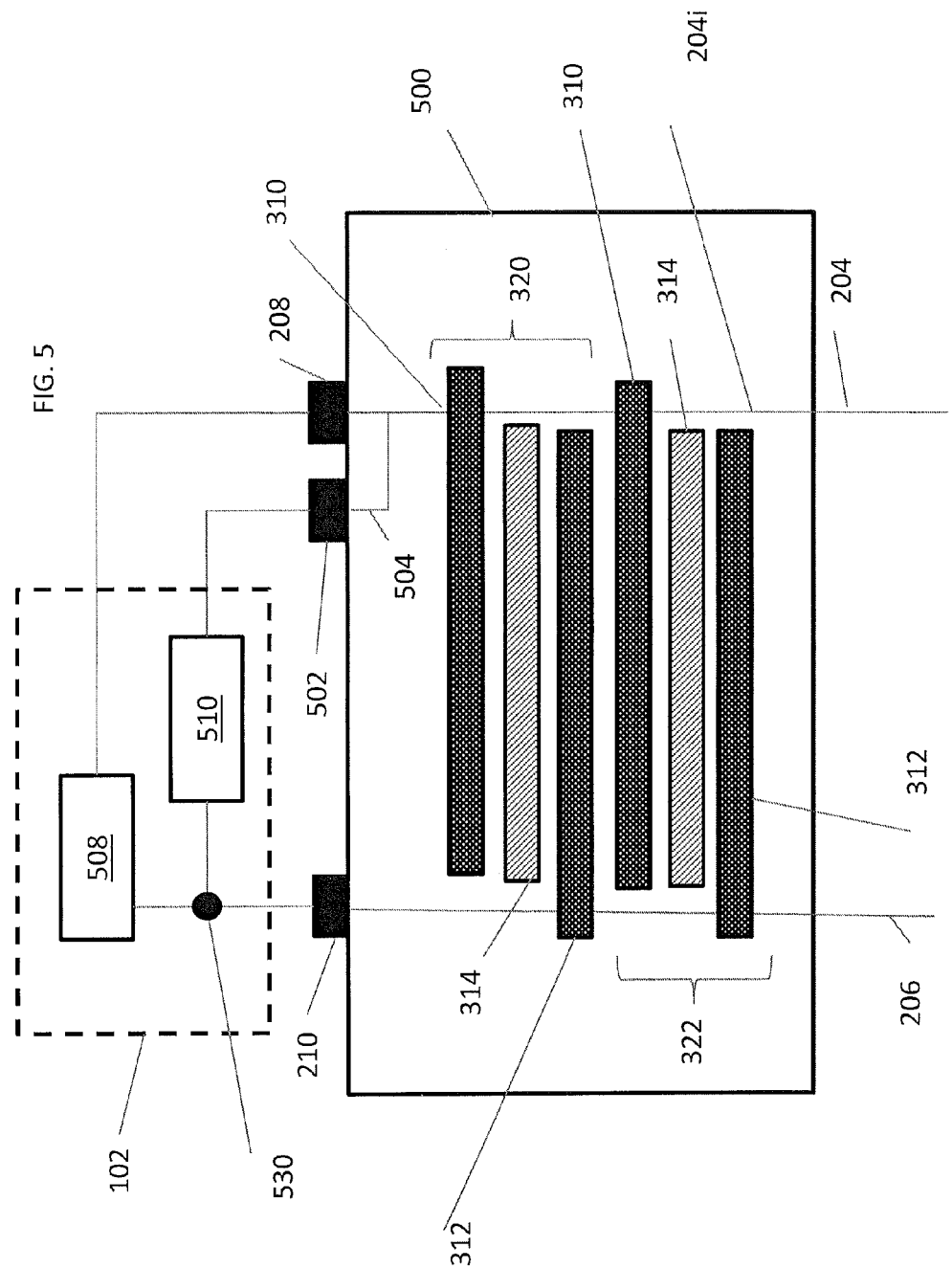
FIG. 5 shows an example capacitor coupled to two different integrated circuits.

With reference now to FIG. 5, an alternative embodiment of a circuit element 500 is shown. As illustrated, the element 500 is a capacitor but other types of elements could be formed. The illustrated embodiment include an additional connection point 502 connected to the internal connection 204i via connection 504. This allows for the signal to be presented on both connection points 208 and 510.

In more detail, FIG. 5 shows an example of an element 500 implemented as a capacitor. In one embodiment, the capacitor is a so-called metal, insulator, metal (MIM) capacitor. Positive 204 and negative connections 206 are shown as including portions that are internal to the capacitor 500 and are denoted as 204i and 206i, respectively. These internal connections may be formed as through silicon vias (TSV's) in one embodiment.

The embodiment of the capacitor 500 shown in FIG. 5 actually includes two parallel capacitors 320, 322 with each being formed by a positive plate 310 connected to connection 204*i* and a negative plate 312 connection 206*i*. The plates of capacitors 320, 322 are separated, at least partially, by an insulating material 314 such as a dielectric.

As illustrated, connection points 208 and 502 may be referred to as positive connections points and they provide, respectively, power to different IC's 508, 510 in the die 102. The connection to the die 102 can the IC's 508, 510 within it can be made with solder balls as described above. Both IC's 508, 510 are connected to a negative or ground connection point 210. As shown, both are connected to the same point 210 as the two chips share a common ground within the die 102 as indicated by connection 530. Of course, each IC could have a unique ground connection and, in such a case, an additional negative or ground connection could be provided by a connection similar to connection 504.

Figure 6:
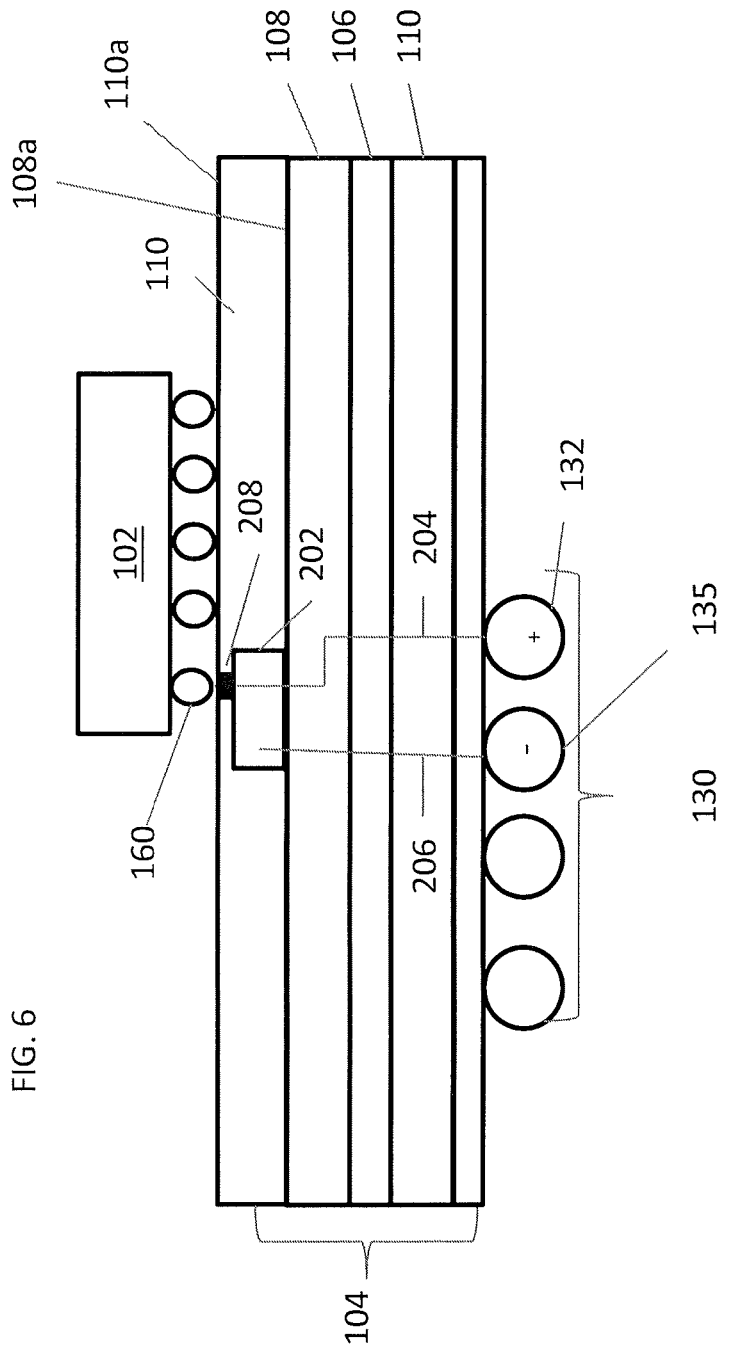
FIG. 6 shows an alternative configuration to that shown in FIG. 2A.

In the above embodiment, the element 202, 500 was under the die 102. In another embodiment, the element may only provide power to the die 102 (on an IC therein) and the die may be connected to a negative or ground by other means. Such is shown in FIG. 6. In this embodiment, only a single TSV may be provided through the element 202. Such an embodiment allows the element 202 to be located only partially under the die 102. The internal connections described above may otherwise apply.

Figure 7:
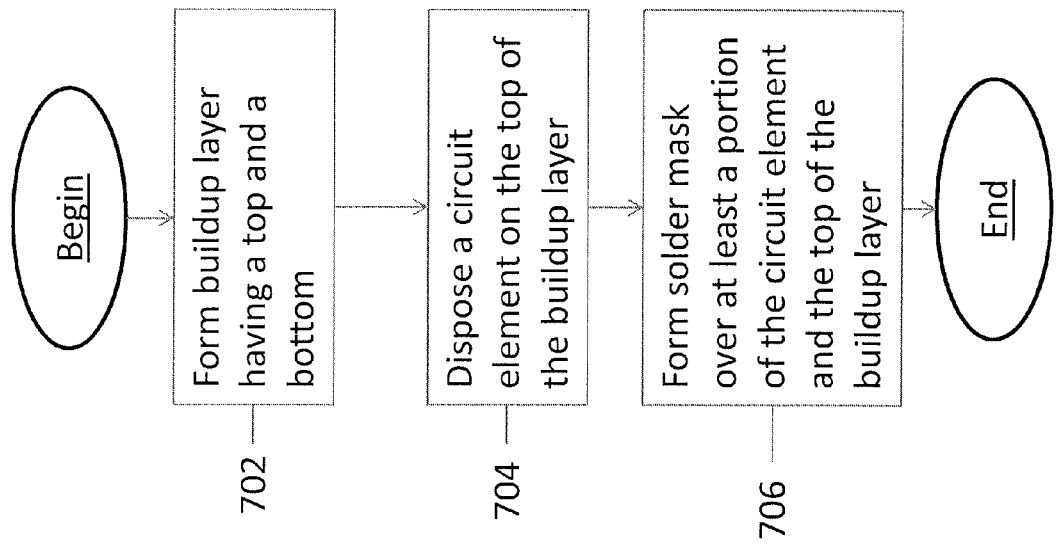
FIG. 7 is a flow chart showing a method according to one embodiment.

FIG. 7 is flow chart showing a method of forming a laminate. At block 702, buildup layer having a top and a bottom is formed. The buildup layer may be a single layer or may include a combination of several layers.

At block 704, a circuit element is disposed on the top of the buildup layer. The circuit element may be any of the elements described above or any other type of circuit element. the circuit element including a first via formed therein that allows for a power signal provided to an underside of the circuit element to be provided to a first connection on a top of the circuit element; and forming a solder mask over at least a portion of the circuit element and the top.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A laminate comprising:
    a buildup layer having a top and a bottom;
    a solder mask contacting the top; and
    a circuit element disposed directly on the top of the buildup layer and at least partially covered by the solder mask, the circuit element including a first via formed therein that allows for a power signal provided to an underside of the circuit element to be provided to a first connection on a top of the circuit element;
    wherein the circuit element is one of: a metal-insulator-metal capacitor, a resistor, an inductor, or a voltage regulator.

2. The laminate of claim 1, wherein the circuit element further includes a second via that allows for a power signal provided to a second connection on the top of the second circuit element to be provided to the underside of the circuit element.

3. The laminate of claim 1, further comprising:
    a positive solder ball; and
    a positive via connecting the positive solder ball to the first via through the buildup layer.

4. The laminate of claim 1, wherein the circuit element further includes:
    a second connection on the top of the circuit element; and
    a second via that allows for a signal provided to the second connection to be provided to the underside of the circuit element;
    and wherein the laminate further includes:
    a negative solder ball; and
    a negative via connecting negative solder ball to the second via through the buildup layer.

5. The laminate of claim 4, further comprising:
    a third connection electrically coupled to the first connection by a connecting path formed within the element;
    wherein the first connection is in electrical communication with a first integrated circuit (IC) and the third connection is in electrical communication with a second IC.

6. The laminate of claim 1, further comprising:
    a core;
    wherein the bottom contacts the core.

7. A module comprising:
    a laminate comprising:
        a buildup layer having a top and a bottom;
        a solder mask contacting the top; and
        a circuit element disposed directly on the top of the buildup layer and at least partially covered by the solder mask, the circuit element including a first via formed therein that allows for a power signal provided to an underside of the circuit element to be provided to a first connection on a top of the circuit element, wherein the circuit element is one of: a metal-insulator-metal capacitor, a resistor, an inductor, or a voltage regulator; and
    a die disposed over the laminate and in electrical communication with the circuit element.

8. The module of claim 7, wherein the circuit element is disposed entirely beneath the die.

9. The module of claim 6, further comprising:
    solder balls connecting the die to the circuit element.

10. The module of claim 7, wherein the circuit element further includes a second via that allows for a power signal provided to a second connection on the top of the second circuit element to be provided to the underside of the circuit element.

11. The module of claim 7, further comprising:
    a positive solder ball; and
    a positive via connecting the positive solder ball to the first via through the buildup layer.

12. The module of claim 7, wherein the circuit element further includes:
    a second connection on the top of the circuit element; and
    a second via that allows for a signal provided to the second connection to be provided to the underside of the circuit element;
    and wherein the laminate further includes:
    a negative solder ball; and
    a negative via connecting positive solder ball to the second via through the buildup layer.

13. The module of claim 12, further comprising:
a third connection electrically coupled to the first connection by a connecting path formed within the element;
wherein the first connection in electrical communication with a first integrated circuit (IC) within the die and the third connection is in electrical communication with a second IC within the die.

14. The module of claim 7, wherein the laminate further includes:
a core;
wherein the bottom contacts the core.

15. A method of forming a laminate comprising:
forming a buildup layer having a top and a bottom;
disposing a circuit element directly on the top of the buildup layer, the circuit element including a first via formed therein that allows for a power signal provided to an underside of the circuit element to be provided to a first connection on a top of the circuit element; and
forming a solder mask over at least a portion of the circuit element and the top;
wherein the circuit element is one of: a metal-insulator-metal capacitor, a resistor, an inductor, or a voltage regulator.

\* \* \* \* \*